United States Patent
Reh et al.

(10) Patent No.: US 9,547,025 B2
(45) Date of Patent: Jan. 17, 2017

(54) APPARATUS AND METHOD FOR AUTOMATIC POWER METERING

(71) Applicant: FABRIQ, LTD., Boulder, CO (US)

(72) Inventors: Jeffrey G. Reh, Longmont, CO (US); Matthew B. O'Kelley, Boulder, CO (US)

(73) Assignee: FABRIQ, LTD., Boulder, CO (US)

( * ) Notice: Subject to any disclaimer, the term of this patent is extended or adjusted under 35 U.S.C. 154(b) by 321 days.

(21) Appl. No.: 14/187,621

(22) Filed: Feb. 24, 2014

(65) Prior Publication Data

US 2015/0061638 A1    Mar. 5, 2015

Related U.S. Application Data

(60) Provisional application No. 61/873,139, filed on Sep. 3, 2013.

(51) Int. Cl.
*G01R 15/12* (2006.01)
*G01R 21/00* (2006.01)
*G01R 22/06* (2006.01)

(52) U.S. Cl.
CPC .......... *G01R 21/001* (2013.01); *G01R 22/063* (2013.01)

(58) Field of Classification Search
CPC ......... G05F 1/70; G01R 15/12; G01R 15/144; G01R 21/06
See application file for complete search history.

(56) References Cited

U.S. PATENT DOCUMENTS

| | | | |
|---|---|---|---|
| 4,182,983 A | 1/1980 | Heinrich et al. | |
| 5,508,617 A | 4/1996 | Komatsu | |
| 6,356,744 B1 | 3/2002 | Zamat | |
| 6,828,771 B1 | 12/2004 | Ghassemi | |
| 7,002,321 B2 | 2/2006 | Mcdaniel et al. | |
| 7,026,807 B2 | 4/2006 | Anderson et al. | |
| 7,031,854 B2 | 4/2006 | Lin et al. | |
| 7,720,576 B2 | 5/2010 | Warren et al. | |
| 7,808,774 B2 | 10/2010 | Tay et al. | |
| 7,933,689 B2 | 4/2011 | Warren et al. | |
| 8,049,487 B2 | 11/2011 | Myers | |
| 8,275,560 B2 | 9/2012 | Radhakrishnan et al. | |
| 8,468,380 B2 | 6/2013 | Munjal et al. | |
| 8,593,135 B2 | 11/2013 | Chemel et al. | |
| 2008/0106241 A1* | 5/2008 | Deaver ................. | H02J 3/1828 323/209 |
| 2009/0108769 A1* | 4/2009 | Ishikita .............. | H05B 41/3927 315/291 |

(Continued)

*Primary Examiner* — Tung X Nguyen
*Assistant Examiner* — Feba Pothen
(74) *Attorney, Agent, or Firm* — Richard K. Huffman

(57) ABSTRACT

An apparatus for automatic power metering within a device is provided. The apparatus includes a metering element and communication elements. The metering element is coupled to a power factor correction circuit at one or more nodes within the device, and is configured to measure and process values on the nodes to generate one or more metering metrics for the device. The metering data includes input power consumed by the device, output power transferred to a load of the device, and power factor corresponding to the device. The communication elements are configured to receive the one or more metering metrics, and are configured to transmit the one or more metering metrics over a communications channel.

23 Claims, 4 Drawing Sheets

(56) References Cited

U.S. PATENT DOCUMENTS

2009/0315467 A1\* 12/2009 Schindler ............... G09G 3/342
 315/185 R
2014/0167609 A1\* 6/2014 Ryu ................... H05B 33/0848
 315/85

\* cited by examiner

PRESENT DAY POWER FACTOR CORRECTION

AUTOMATIC POWER METERING APPARATUS

APPARATUS AND METHOD FOR AUTOMATIC POWER METERING

CROSS-REFERENCE TO RELATED APPLICATIONS

This application claims the benefit of the following U.S. Provisional Application, which is herein incorporated by reference for all intents and purposes.

| SERIAL NUMBER | FILING DATE | TITLE |
|---|---|---|
| 61873139 (CNTR.XXXX) | Sep. 3, 2013 | APPARATUS AND METHOD FOR AUTOMATIC POWER METERING |

BACKGROUND OF THE INVENTION

Field of the Invention

This invention relates in general to the field of building energy management systems (BEMSs), and more particularly to technique that provides for automatic power metering at the device level.

Description of the Related Art

The problem with resources such as electrical power, water, fossil fuels, and their derivatives (e.g., natural gas) is that the generation and consumption of a resource both vary with respect to time. In addition, the delivery and transport infrastructure limits instantaneous matching of generation and consumption. These resources are limited in supply and the demand for this limited supply is constantly fluctuating. As anyone who has participated in a rolling blackout will agree, the times are more and more frequent when resource consumers are forced to face the realities of limited resource supply.

Most notably, the electrical power generation and distribution industry has taken proactive measures to protect limited instantaneous supplies of electrical power by imposing financial disincentives such as peak demand charges and time-of-use (TOU) pricing for the creation of high peak demand and the consumption of electricity during peak demand periods. Heretofore, consumers merely paid for the total amount of power that they consumed over a billing period. Today most energy suppliers not only charge customers for the total amount of electricity they consume over the billing period, but they additionally bill the customers for their peak demand reading, that is, the greatest amount of energy that is used during a measured period of time. Additionally, energy suppliers are beginning to charge higher rates for power consumed during peak demand periods with mechanisms such as time-of-use pricing.

For example, consider a factory owner whose building includes 2,000 fluorescent light fixtures, each consuming 100 Watts when fully on. If all the fixtures are on at full power during the measuring period, then the peak demand for that period is 200 KW. Not only does the energy supplier have to provide for instantaneous generation of this power in conjunction with loads exhibited by its other consumers, but the distribution network that supplies this peak power must be sized such that it delivers 200 KW to the factory. Consequently, it is standard practice today that customers that create high peak demand and consume electricity during peak demand periods are required to pay a surcharge to offset the costs of peak energy generation and distribution.

In addition to financial disincentives for contributing to peak demand, many utilities (e.g., Pacific Gas & Electric) offer financial incentives to customers to actively reduce peak and overall demand through participation in so called demand response and energy efficiency programs, as well as to upgrade to more efficient and controllable building equipment. In demand response programs, utilities pay incentives for reducing demand "on-call" during peak demand periods such as hot summer afternoons. In energy efficiency programs, utilities pay incentives for making their building more efficient, thereby consuming less electricity overall. This process often includes building energy audits, upgrades to more efficient equipment (e.g., heating, ventilation, and air conditioning (HVAC); lighting; etc.), and the installation of building controls and energy management systems. Since, building owners, among others, are not necessarily trained or equipped to fully exploit the savings opportunities offered by the utilities, an entire industry of intermediaries has developed to provide the knowledge, equipment, service, and capital necessary to participate in demand response and energy efficiency programs, as well as to make their buildings more efficient with new equipment and controls. These intermediaries, or Energy Management Companies (EMCs), include demand management service providers like ENERNOC, INC.®, energy service companies (ESCOs) like AMERESCO®, and others. Demand management service companies enable participation in demand response programs, they monitor and manage peak demand creation, they optimize consumption in light of time-of-use pricing, as well as performing other services. Overall, they seek to save the customer more than the demand management service costs. ESCOs install new, more efficient HVAC and lighting equipment in facilities. The also own the equipment for a period of time, thus earning payback and profit on their investment through the savings that they create. All EMCs seek to leverage incentives from utilities in order to improve the value they offer their customers and to increase their returns. In order to prove the value that they have created, both to the customer and to the utility, EMCs are often burdened with the obligation of "measurement and verification" (M&V) of reduced demand or efficiency created.

As a standard practice, ESCOs generally own the new equipment they install (at no cost to the building owner) in the building for seven to 10 years, and contract with the building owner to produce a specified amount of efficiency, which results in a lower utility bill. These "savings" are the difference between what the bill would have been without the efficiency measures and what the new, lower bill is with them in place. During the performance period, the ESCO is paid the bulk of the savings created and the remainder accrues to the building owner. The ESCO generally achieves payback inside of 75 percent of the performance period and profits until conclusion. The building owner has a slightly lower utility bill during the performance period and a much lower utility bill afterwards, in addition to owning a more efficient building with new equipment with no cash outlay. In essence, an ESCO guarantees performance to the building owner while assuming the risk of underperformance. However, in order to create a performance contract with the building owner, ESCOs must be able to prove the efficiency that they create. In the past, ESCOs have limited their activities to the simple replacement of inefficient equipment with equipment that consumes less electricity. For example, an ESCO might replace existing T12 fluorescent lamps and ballasts with more efficient T8 lamps and ballasts. In this case, the efficiency created is known on the front end of the project and no measurement and verification during the project is necessary.

The present inventors have observed that substantial energy savings can be obtained through the employment of lighting control systems that include such devices as dimmable lighting electronics (e.g., fluorescent ballasts, LED drivers), daylight harvesters, and occupancy sensors. Lighting control systems achieve efficiencies of 60-80 percent by actively modifying the lighting levels according to need (e.g., dimming or turning off lamps when a room is not occupied, leveraging ambient light entering the building through windows and skylights by dimming lighting to only what is necessary to achieve suitable overall lighting levels, etc.). What is precluding ESCOs and others from implementing these control systems in a performance contracting model is the fact that they are inherently dynamic in nature, and actual efficiency created is dependant on more variables than simply installing more efficient electronics. Thus, the present inventors have noted that ESCOs need a cost-effective and accurate method of measuring and verifying efficiency created in dynamic control systems such as a lighting control system. Furthermore, the present inventors have noted that it is virtually impossible to measure lighting energy use only at the meter or circuit breaker level, due to the "noise" created by many other electrical loads in the building. These factors act as disincentives for ESCOs to install dynamic lighting control systems.

Consequently, the problem of measuring and verifying actual efficiency created by dynamic control systems extends beyond lighting to HVAC systems, motors, and other electrical loads.

Utilities require by contract that demand management service providers measure and verify curtailed load during demand response events in order to be paid for the service. Heretofore, the majority of electrical loads employed in demand response programs has been large industrial loads that customers are willing to shut down during a demand response event. These large loads have known electrical footprints and their curtailment can easily be measured and verified at the meter with a common power meter. Much attention has been given by utilities and EMCs to extend demand response programs beyond the industrial context into commercial buildings using lighting and HVAC as the curtailable load. To date, this has occurred in a very small percentage of commercial buildings. In order to effectively control loads such as lighting and HVAC that owners and tenants of building depend upon for quality of service, dynamic control systems such as are noted above are often employed, making it difficult or prohibitively expensive to measure and verify the load curtailed during an event. This has limited the deployment of demand response programs in commercial buildings.

Utilities and industry players have promoted and developed the Open Automated Demand Response (OpenADR) standard that defines a communication protocol between utilities and automated infrastructure in commercial buildings for demand response purposes. According to OpenADR, utilities communicate demand response events to intelligent energy management systems in commercial buildings, which acknowledge receipt of the event notification. However, the utility has no insight into how much curtailable load exists prior to the event nor the actual amount of load curtailed building by building during or after the event. This is primarily because no technology exists in commercial buildings to cost effectively measure power consumption at the device level. And the present inventors have noted that with such technology, an energy management system could compare current consumption levels with demand response tolerance profiles established by the building owner, device by device, and advertise to the utility in real-time the demand response "capacity" of the building. This would dramatically improve the effectiveness of OpenADR programs and improve the efficiency of the utility's grid.

The present inventors have also noted that demand management service providers can reduce building owner utility bills by monitoring and limiting peak energy consumption of the building. The ability to perform this service is greatly enhanced by the ability to cost-effectively measure power at the device level, particularly in the context of dynamic control systems. By understanding power consumption at the device level and in aggregate for the building, the service provider can adjust and curtail discretionary loads temporarily in real-time, thereby avoiding unnecessary and costly artificial peak consumption.

The present inventors further note that demand management service providers can further reduce building owner utility bills by adjusting and timing consumption according to variable time-of-use rate structures that are increasing employed by utilities. Again, the ability to perform this service is greatly enhanced by the ability to cost-effectively measure power at the device level. Some loads are more discretionary than others (e.g., lowered lighting levels are generally more tolerable than increased temperatures), and understanding the power consumption and real-time cost at the device level increases the effectiveness of the service.

Many utilities subsidize the creation of more efficient buildings by paying incentives for the installation of more efficient lighting and HVAC equipment. While the value of more efficient equipment is well understood and incentives can be sized appropriately, the present inventors note that the value of dynamic control systems as described above is less so. For the same reasons that ESCOs are hesitant to install dynamic control systems, utilities are hesitant to pay blindly for incentives for dynamic control systems. However, the present inventors have observed that with the ability to cost-effectively measure power at the device level, utilities would be able to size incentives based upon real-world measurements of efficiency created once the system was installed. The lack of such technology limits the growth of energy efficiency programs and the dissemination of highly efficient dynamic control systems.

Therefore, what is needed is a cost effective mechanism for measuring power consumption at the device level (e.g. fluorescent ballast, LED driver, HVAC equipment, power supplies, etc.).

What is additionally needed is an apparatus for automatic power metering that utilizes existing access points in common original equipment manufacturer (OEM) device electronics (e.g. fluorescent ballast, LED driver, HVAC equipment, power supplies, etc.) to obtain sub-metering data.

What is further needed is a low cost technique for implementing power metering at the device level, which operates in conjunction with existing power factor correction circuitry.

SUMMARY OF THE INVENTION

The present invention, among other applications, is directed to solving the above-noted problems and addresses other problems, disadvantages, and limitations of the prior art by providing a superior technique for performing in-device power metering that is both cost effective and easy to implement. In one embodiment, an apparatus for automatic power metering within a device is provided. The apparatus includes a metering element and communication elements. The metering element is coupled to a power factor correction circuit at one or more nodes within the device, and is configured to measure and process values on the one or more nodes to generate one or more metering metrics for the device. The communication elements are configured to receive the one or more metering metrics, and are configured to transmit the one or more metering metrics over a communications channel.

One aspect of the present invention contemplates a sub-metering mechanism within a device. The sub-metering mechanism has a power factor correction circuit, a metering element, and communication elements. The power factor correction circuit is coupled to current sense, output voltage sense, and input voltage sense nodes within the device, and is configured to control a switching transistor to shunt input current in parallel with a load to align the phase of the input current with the phase of an input voltage. The metering element is coupled to one or more of the nodes, and is configured to measure and process values on the one or more of the nodes to generate one or more metering metrics for the device. The one or more metering metrics includes input power consumed by the device, output power transferred to the load, and power factor corresponding to the device. The communication elements are configured to receive the one or more metering metrics, and are configured to transmit the one or more metering metrics over a communications channel.

Another aspect of the present invention comprehends a method for automatically metering power within a device. The method includes coupling a metering element to a power factor correction circuit at one or more nodes within the device, wherein the nodes comprise a current sense node, an output voltage sense node, and an input voltage sense node; measuring and processing values on the nodes to generate one or more metering metrics for the device, wherein the metering metrics comprise input power consumed by the device, output power transferred to a load of the device, and power factor corresponding to the device; and via communication elements, transmitting the one or more metering metrics over a communications channel.

BRIEF DESCRIPTION OF THE DRAWINGS

These and other objects, features, and advantages of the present invention will become better understood with regard to the following description, and accompanying drawings where.

DETAILED DESCRIPTION

Figure 1:
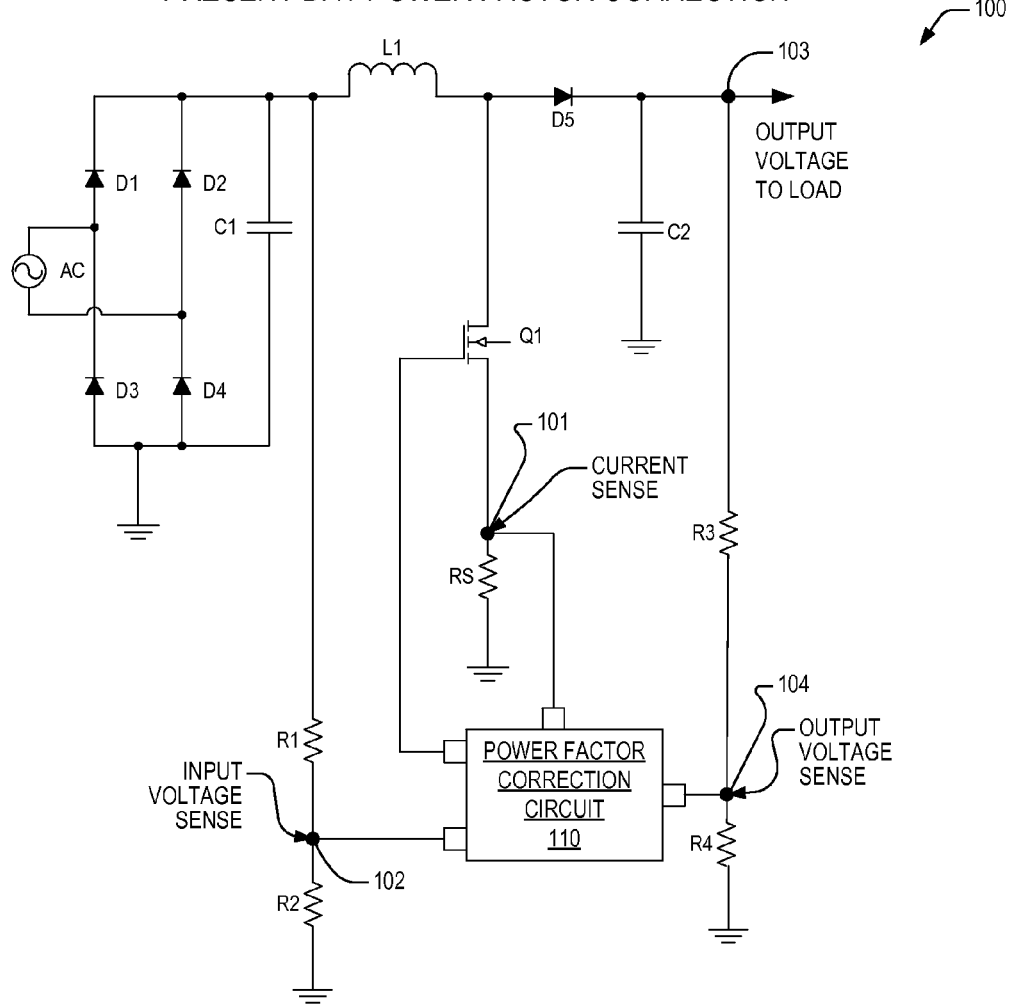
FIG. 1 is a schematic diagram illustrating power correction in a present day electronic device.

Exemplary and illustrative embodiments of the invention are described below. In the interest of clarity, not all features of an actual implementation are described in this specification, for those skilled in the art will appreciate that in the development of any such actual embodiment, numerous implementation specific decisions are made to achieve specific goals, such as compliance with system-related and business related constraints, which vary from one implementation to another. Furthermore, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present invention will now be described with reference to the attached figures. Various structures, systems, and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase (i.e., a definition that is different from the ordinary and customary meaning as understood by those skilled in the art) is intended to be implied by consistent usage of the term or phrase herein. To the extent that a term or phrase is intended to have a special meaning (i.e., a meaning other than that understood by skilled artisans) such a special definition will be expressly set forth in the specification in a definitional manner that directly and unequivocally provides the special definition for the term or phrase.

DEFINITIONS

Integrated Circuit (IC): A set of electronic circuits fabricated on a small piece of semiconductor material, typically silicon. An IC is also referred to as a chip, a microchip, or a die.

Central Processing Unit (CPU): The electronic circuits (i.e., "hardware") that execute the instructions of a computer program (also known as a "computer application" or "application") by performing operations on data that include arithmetic operations, logical operations, and input/output operations.

Microprocessor: An electronic device that functions as a CPU on a single integrated circuit. A microprocessor receives digital data as input, processes the data according to instructions fetched from a memory (either on-die or off-die), and generates results of operations prescribed by the instructions as output. A general purpose microprocessor may be employed in a desktop, mobile, or tablet computer, and is employed for uses such as computation, text editing, multimedia display, and Internet browsing. A microprocessor may also be disposed in an embedded system to control a wide variety of devices including appliances, mobile telephones, smart phones, and industrial control devices.

Microcontroller: A small computer on a single integrated circuit containing a microprocessor core, memory, and programmable input/output peripherals. Program memory in the form of flash or one-time programmable (OTP) read only memory (ROM) is also often included on chip, as well as a typically small amount of random access memory (RAM).

Microcontrollers are designed for embedded applications, in contrast to the microprocessors used in personal computers or other general purpose applications.

Instruction Set Architecture (ISA) or Instruction Set: A part of a computer architecture related to programming that includes data types, instructions, registers, addressing modes, memory architecture, interrupt and exception handling, and input/output. An ISA includes a specification of the set of opcodes (i.e., machine language instructions), and the native commands implemented by a particular CPU.

x86-Compatible Microprocessor: A microprocessor capable of executing computer applications that are programmed according to the x86 ISA.

Microcode: A term employed to refer to a plurality of micro instructions. A micro instruction (also referred to as a "native instruction") is an instruction at the level that a microprocessor sub-unit executes. Exemplary sub-units include integer units, floating point units, MMX units, and load/store units. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a sub-unit or sub-units within the CISC microprocessor.

In view of the above background discussion on building management, lighting controls, and the need in the art for real time power metering, a discussion of the techniques used for power factor correction in a present day electronic device, such as a lighting ballast, will be discussed with reference to FIG. 1. Following this, a discussion of the present invention will be presented with reference to FIGS. 2-4. The present invention provides a cost-effective and improved technique for performing automatic power metering at device level by leveraging off of currently fielded devices that include power factor correction circuits.

Referring to FIG. 1, a schematic diagram is presented illustrating power factor correction in a present day electronic device 100. As is alluded to above, many present day electronic devices require power factor correction to align real power delivered to a load with apparent power flowing through the power source of the load. As one skilled in the art will appreciate, purely reactive electronic devices, such as induction motors, can be corrected by the addition of passive power factor correction components (e.g., capacitors). However, one skilled in the art will also appreciate that other electronic devices, such as those having power supplies and rectifiers disposed therein, introduce non-linear loads to the power source and, hence, require more elaborate mechanisms, such as active power factor correction circuits, to raise power factor by correcting distortions of current drawn from the power source. Though power factor may be raised at the substation or distribution point level, more often than not, a present day electronic device will come with a built-in power factor correction circuit. It is well known that lamp ballasts, light emitting diode (LED) drivers, and lighting controls are prime examples of devices that come with rectified power supplies, and thus also include built-in power factor correction circuits.

It is not within the scope of the present application to provide an in-depth tutorial of the causes of poor power factor and the various techniques employed within present day devices to raise power factor. Rather, it is sufficient for purposes of the present application to note that power factor correction circuits are employed within many present day electronic devices, and that those elements do so by monitoring rectified source voltage and voltage provided to a load, and modulating current through a parallel load (e.g., an inductor) in order to shape and align source current in phase with source voltage, thus raising the power factor of the device, minimizing harmonic distortion, and maximizing real power delivered to the load.

Accordingly, FIG. 1 shows a rectified AC power supply 100 that includes a power factor correction (PFC) circuit 110 to minimize reactive current losses in alternating current (AC) power transmission lines. The supply 100 is typical of that which may be found in many different electronic devices. In particular, the supply 100 may be employed in a fluorescent light fixture ballast, a light emitting diode (LED) fixture driver, or a switched mode power supply. As one skilled in the art will appreciate, many governments and regulatory agencies require that these power consuming devices, such as the supply 100 of FIG. 1, achieve a specified minimum power factor (PF) rating. In addition, one skilled in the art of power supplies and PFC circuits will further appreciate that the supply 100 is one of the more prevalent mechanisms for integrating PFC at the device level. As is depicted, an AC power signal enters a diode bridge formed by diodes D1-D4, which rectifies the AC power signal, thus generating a full wave rectified voltage signal. Capacitor C1 adds noise filtering to the full wave rectified voltage signal. The filtered, full wave rectified voltage signal is divided down through resistors R1 and R2 to produce an input voltage sense signal, which is provided via an input voltage sense node 102 to the PFC circuit 110. The input voltage sense signal is, thus, an attenuated representation of the noise filtered, full wave rectified voltage signal, and is also representative the voltage of the AC power signal.

The supply 100 also includes a transistor Q1, inductor L1, diode D5, and bulk capacitor C2, which together form a conventional boost converter. In operation, the PFC circuit 110 controls the base of Q1 such that Q1 switches on and off at a much higher frequency than the AC input power signal frequency. The PFC circuit 110 thus controls the on and off times for Q1. For example, it may be desirable that Q1 have a longer on time at maximum amplitude of the input voltage sense signal taken at node 102. The longer on time thus generates a greater current amplitude through inductor L1. Conversely, a smaller on time generates a smaller amplitude of current through inductor L1. The current through L1 is determined by measuring a voltage drop across a current sensing resistor RS, which is provided by a current sense node 101 to the power factor correction circuit 110.

Accordingly, the PFC circuit 110 attempts to match the phase of the current through L1, as sensed by RS at the current sense node 101, to the phase of the voltage of the AC power signal, as sensed at the input voltage sense node 102, by modulating the on and off time of Q1. Simultaneously, the PFC circuit 110 is configured to regulate an output voltage to load. The PFC circuit 110 senses the output voltage to the load at an output voltage to load node 103 by a divided down representation of the output voltage through resistors R3-R4, which is provide to the PFC circuit 110 at an output voltage sense node 104.

Thus, a present day device, such as the supply 100 of FIG. 1, includes a PFC circuit 110 that is monitors input voltage at an input voltage sense node 102 and output voltage to a load at an output voltage sense node 104. The PFC circuit 110 further modulates the on and off times of a transistor Q1 to increase/decrease input current flow through the inductor L1, where a discontinuous representation of resulting input current is sampled at a current sense node 101 to provide for an estimation by the PFC circuit 110 of the phase of the modulated input current. As one skilled in the art will concur, PFC circuits such as the PFC circuit 110 of FIG. 1, may be purchased from a number of well known manufacturers, and such circuits may comprise discrete circuitry, an integrated circuit die, or a combination thereof having at least inputs for input voltage, output voltage, current sense, and an output for switching a shunt load on and off. The switching transistor may be disposed within the PFC circuit 110 itself As is alluded to above, the present inventors have observed that power factor correction circuits are disposed within most present day electronic devices that employ rectified AC power for the purpose of driving non-linear loads. And they have further observed an increasing need in the art, and particularly in the areas of lighting control systems and building management, for cost effective and robust techniques to achieve power metering at the device level. Accordingly, the present invention will now be discussed with reference to FIGS. 2-4, where in-device PFC circuits allow for access to signal nodes in the device that may be sampled and processed into data required for power metering by an automatic power metering mechanism also disposed within the device, thus providing a cost effective solution for device level power metering.

Figure 2:
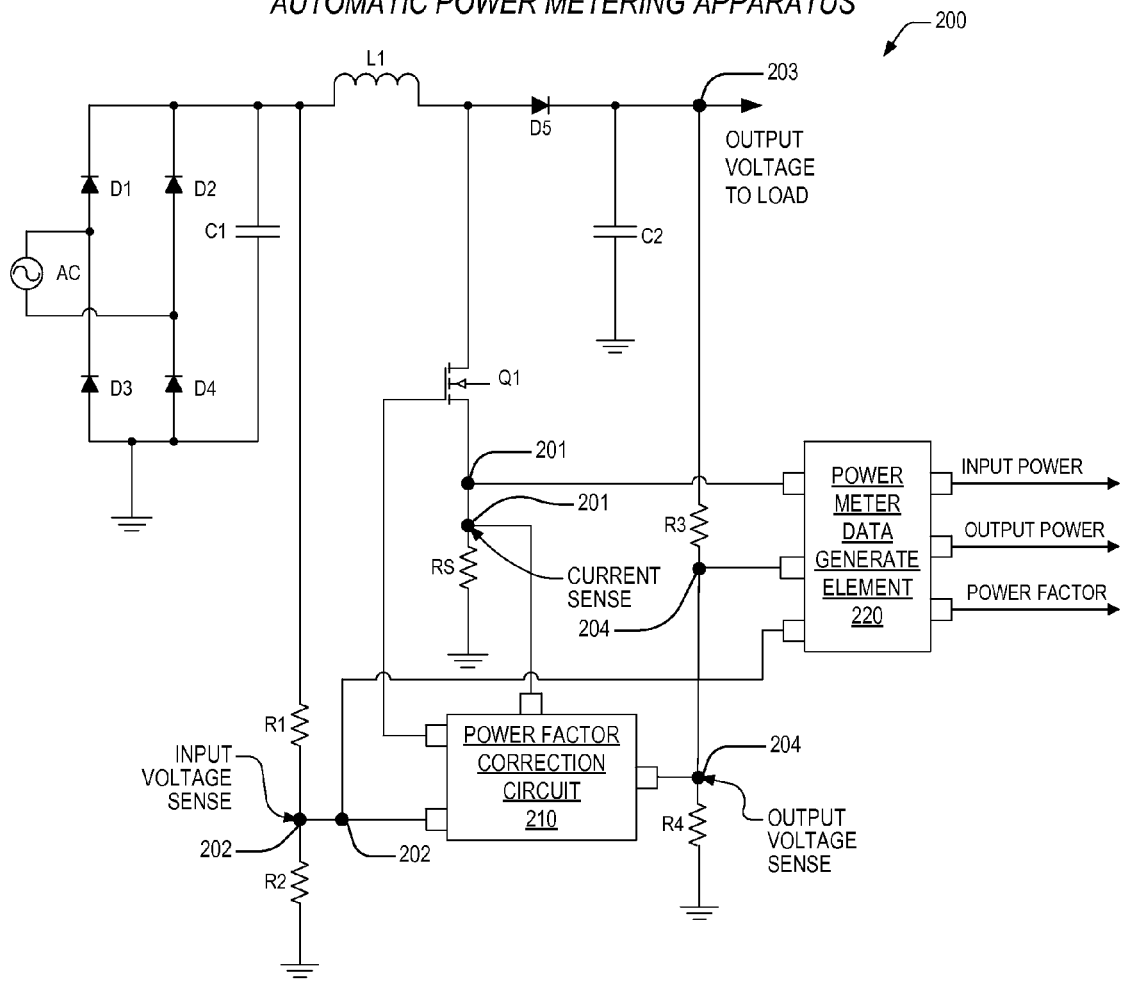
FIG. 2 is a schematic diagram depicting an automatic power metering apparatus according to the present invention.

Turning to FIG. 2, a schematic diagram is presented depicting an automatic power metering apparatus according to the present invention. The power metering apparatus is disposed within an electronic device 200 such as, but not limited to, a fluorescent light fixture ballast, an LED driver, or a switched mode power supply. Like the device 100 of FIG. 1, the device 200 according to the present invention may comprise an AC power supply 200 that includes a PFC circuit 210 to minimize reactive current losses in alternating current (AC) power transmission lines. Thus, an AC power signal enters a diode bridge formed by diodes D1-D4, which rectifies the AC power signal, thus generating a full wave rectified voltage signal. Capacitor C1 adds noise filtering to the full wave rectified voltage signal. The filtered, full wave rectified voltage signal is divided down through resistors R1 and R2 to produce an input voltage sense signal, which is provided via an input voltage sense node 202 to the PFC circuit 210. The input voltage sense signal is, thus, an attenuated representation of the filtered, full wave rectified voltage signal, and is also representative the voltage of the AC power signal.

The supply 200 also includes a transistor Q1, inductor L1, diode D5, and bulk capacitor C2, which together form a boost converter. Operationally, the PFC circuit 210 controls the base of Q1 such that Q1 switches on and off at a much higher frequency than the AC input power signal frequency. The PFC circuit 210 thus controls the on and off times for Q1. If Q1 has a longer on time at maximum amplitude of the input voltage sense signal taken at node 202, then a greater current amplitude will be passed through inductor L1. Conversely, a shorter on time generates a smaller amplitude of current through inductor L1. The current through L1 is determined by measuring a voltage drop across a current sensing resistor RS, which is provided by a current sense node 201 to the power factor correction circuit 210.

Although multiple instances of nodes 201-203 are depicted in the diagram 200, one skilled in the art will appreciate that the multiple instances represent a single electrical coupling point for each of the nodes 201-203.

Accordingly, the PFC circuit 210 attempts to match the phase of the current through L1, as sensed by RS at the current sense node 201, to the phase of the voltage of the AC power signal, as sensed at the input voltage sense node 202, by modulating the on and off time of Q1. Simultaneously, the PFC circuit 210 is configured to regulate an output voltage to load. The PFC circuit 210 senses the output voltage to the load at an output voltage to load node 203 by a divided down representation of the output voltage through resistors R3-R4, which is provided to the PFC circuit 210 at an output voltage sense node 204.

Thus, the supply 200 according to the present invention includes a PFC circuit 210 that is monitors input voltage at an input voltage sense node 202 and output voltage to a load at an output voltage sense node 204. The PFC circuit 210 further modulates the on and off times of a transistor Q1 to increase/decrease input current flow through the inductor L1, where a representation of resulting discontinuous input current is sampled at a current sense node 201 to provide for an estimation by the PFC circuit 210 of the phase of the modulated input current. In one embodiment, the transistor Q1 may be disposed internal to the PFC circuit 210.

In contrast to a conventional power supply, such as the supply 100 of FIG. 1, the supply 200 according to the present invention includes a power meter data generate element 220, that is coupled to the input voltage sense node 202, the output voltage sense node 204, and the input current sense node 201—the very same nodes 201-202, 204 to which the PFC circuit 220 is coupled.

Operationally, the power meter element 220 measures the voltages and current at each of the nodes 201-202, 204 and processes the measured data to generate real time power consumption information and related power information (e.g., power factor, input voltage magnitude) for the device 200. Such information will henceforth be referred to as "sub-metering data." In one embodiment, the power meter element 220 comprises analog circuits that measure and process the voltages and current. In another embodiment, the power meter element 220 comprises digital circuits that measure (i.e., sample) and process the voltages and current. A further embodiment comprises a combination of analog and digital circuits to measure and process the voltages and current. Processing of the measured voltages and current may comprise operations in the time domain, or conversion of the measured voltages and current into the frequency domain, processing of the converted measurements, and conversion back into the time domain. The sub-metering data is then transmitted over a communications channel (not shown) to a central aggregating node (not shown) or other point of reception (not shown), where it may be used in real or non real time for such purposes as, but not limited to, validating estimates of load shedding, validating power factor correction, predicting demand capacity, and determining daylight harvesting efficiency.

In one embodiment, the power metering element 220 is disposed within an electronic lighting ballast. Alternatively, the element 220 is disposed in another electronic device, such as but not limited to, a power supply like the supply 200 of FIG. 2, or an electronic device having an internal power supply. Preferably, devices will include an existing PFC circuit 210 as is shown in FIG. 2. The existing PFC circuit 210 may be of any of the well known PFC architectures including, but not limited to, critical conduction mode and continuous conduction mode. Accordingly, one aspect of the present invention provides for the integration of the power meter data generate element 220 to leverage an existing PFC circuit 210 having input nodes including input voltage sense 202, input current sense 201, and output voltage sense 204, as is shown in FIG. 2. The present inventors note that since the principles associated with the present invention are broad enough to comprehend virtually any electronic device 200 that includes a PFC circuit 210, a general load (not shown) is contemplated, which exhibits reactive attributes.

The power meter data generate element 220 according to the present invention may comprise a microcontroller (not shown) that is coupled to a memory (not shown). The memory may comprise programs and data stored therein that are required to execute the functions described herein. Although the memory is contemplated external to the microcontroller, embodiments are contemplated that utilize a microcontroller having on-board memory. The power meter data generate element 220 is coupled to nodes current sense 201, input voltage sense 202, and output voltage sense 204. The power meter data generate element samples and processes data from each of the nodes 201-202, 204 and generates outputs for input power, output power, and power factor. The outputs are representative of input power to the device 200, output power of the device 200, and power factor of the device 200.

Operationally, in the microcontroller embodiment, the power meter data generate element 220 measures and processes voltages sensed by current sense 201, input voltage sense 202, and output voltage sense 204 by digitizing and buffering the voltages, respectively. The digitized and buffered voltages are provided to the microcontroller, which executes the programs stored in memory. The programs comprise algorithms configured to process the sensed voltages in order to generate representations of the power consumed by the device 200, both real and reactive. These representations are provided via the input power and output power outputs. The algorithms also generate a representation of power factor correction and power consumed by the load, and this representation is provided to the power factor output. The algorithms may process the data in either the time domain or the frequency domain.

The present inventors note that the power meter data generate element 220 according to the present invention may be tailored to deliver a subset of the outputs noted above, according to operational requirements, or may be tailored to deliver intermediate values, such as buffered voltage samples, partially processed data (e.g., buffered voltages processed to provide root mean square (RMS) values, etc.).

One embodiment of the present invention contemplates integration of the power meter data generate element 220 into the same circuit ("die") as the PFC circuit 210, with additional components and outputs described above to perform the metering function and to tailor each device for the appropriate power levels.

Figure 3:
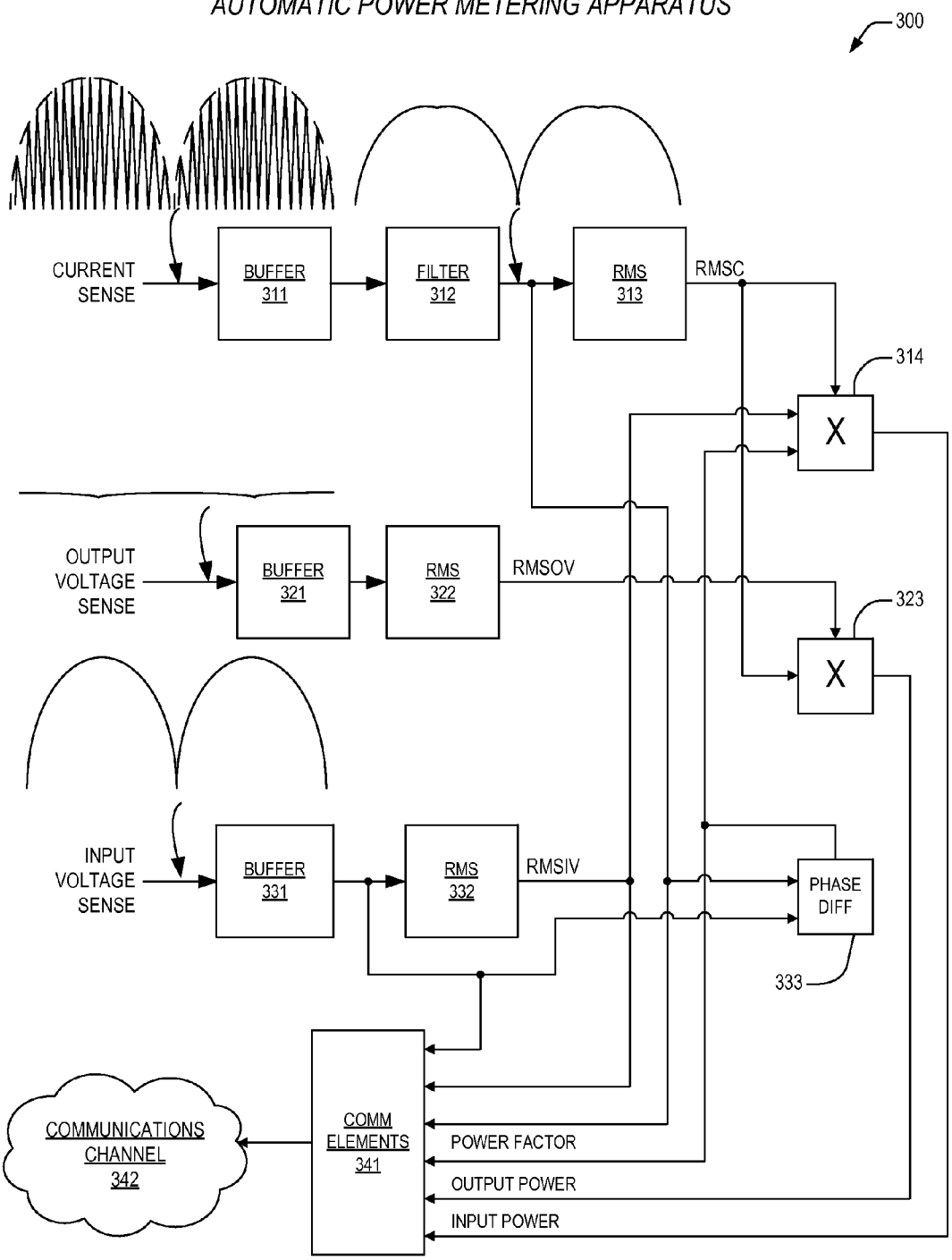
FIG. 3 is a block diagram featuring details of the automatic power metering apparatus according to the present invention.

Referring now to FIG. 3, a block diagram is presented featuring details of the automatic power metering apparatus 300 according to the present invention. The metering apparatus 300 includes communication elements 341 that are configured to receive the outputs provided by the power meter data generate element 220, which are then provided over a conventional communications channel 342 to an aggregate node (not shown). The communication elements 341 may be external or internal to a device in which the apparatus 300 is disposed, and may comprise wired transceivers or wireless radios that comport with any known communication protocol including, but not limited to, either wired protocols (e.g., CANbus, Modbus, Ethernet, DALI, SPI) or wireless protocols (e.g., Wi-Fi, ZigBee, Cellular). The aggregate node, in one embodiment may comprise a cloud server. In another embodiment, the aggregate node may share processing resources with the power meter generate element 220.

Accordingly, the apparatus 300 includes functional blocks of the power meter data generate element 220, that measures voltages on the same sense nodes 201-202, 204 as the PFC circuit 210. The power meter data generate element 220 has an input current sense buffer 311 that samples a representative discontinuous input current sense voltage at node 201. The output of the input current sense buffer 311 is coupled to a filter 312, the output of which represents the continuous inductor current and is provided to a first root mean square (RMS) converter 313. The output of the filter 312 is also coupled to a phase difference element 333 and to the communication elements 341. The output of the first RMS converter 313 is provided to a first generator element 314 and a second generator element 323.

The power meter element 220 also includes an output voltage sense buffer 321 that measures a representative output voltage at node 204. The output of the output voltage sense buffer 321 is coupled to a second RMS converter 322, the output of which is provided to the second generator element 323.

The power meter element 220 further includes an input voltage sense buffer 331 that measures a representative input voltage at node 202. The output of the input voltage sense buffer 331 is coupled to the communication elements 341, the phase difference element 333, and a third RMS converter 332. The output of the third RMS converter 332 is coupled to the first generator element 314 and to the communication elements 341.

The first generator element 314 generates an input power signal at its output, which is coupled to the communication elements 341. The second generator element 323 generates an output power signal at its output, which is coupled to the communication elements 341. The phase difference element 333 generates a power factor signal at its output, which is also coupled to the communication elements 341.

In operation, regarding measurement of input current, buffer 311 measures and buffers the voltage at node 201, which is representative of input current while transistor Q1 is on. Measurements of the input current while transistor Q1 is on are filtered by the filter 312 to yield reconstructed rectified input current samples, both in magnitude and phase. The reconstructed rectified input current samples are then provided to RMS element 313, which converts the samples to RMS values. The RMS values of the input current are output on signal RMSC. Signal RMSC is then provided to the first and second generators 314, 323.

Regarding measurement of output voltage, buffer 321 measures and buffers the voltage at node 204, which is representative of output voltage. These measurements are provided to RMS element 322, which converts the measurements to RMS values. The RMS values of the output voltage are output on signal RMSOV, which is provided to the second generator 323.

Regarding measurement of input voltage, buffer 331 measures and buffers the voltage at node 202, which is representative of input voltage. These measurements are provided to RMS element 332, which converts the samples to RMS values. The RMS values of the input voltage are output on signal RMSIV, which is provided to the first generator 314 and to the communication elements 341.

The first generator 314 combines the RMS values of input current, input voltage, and phase difference to yield real input power for the device 200, which is provided to the communication elements 341 on signal input power. In like manner, the second generator 323 combines the RMS values of input current and output voltage to yield output power for the device 200, which is provided to the communication elements 341 on signal output power. The phase difference element 333 compares the reconstructed values of rectified input current 312 and rectified input voltage 331 to determine phase difference between the two, which is provided along with power factor for the device 200 on signal power factor to the communication elements 341.

Although the automatic power metering apparatus 300 according to the present invention is described in detail above in terms of application programs executing on a microprocessor to perform the recited functions, the present inventors note that the metering apparatus 300 may be embodied in other manners as well to include a power meter data generate element 220 that achieves generation of the outputs via analog circuits configured to perform the functions described herein, digital circuits that are configured to perform the functions described herein, or a combination of analog and digital configurations. And as is discussed above, the sensed signals may be digitized and processed within a microprocessor using algorithms disposed in programs stored in a memory. Furthermore, the sensed signals may be processed by the power meter generate element 220 utilizing analog circuitry, digital circuitry, or a combination of analog and digital circuitry.

The automatic power metering apparatus 300 according to the present invention is configured to perform the functions and operations as discussed above. The metering apparatus 300 may comprise logic, circuits, devices, or microcode (i.e., micro instructions or native instructions), or a combination of logic, circuits, devices, or microcode, or equivalent elements that are employed to execute the functions and operations according to the present invention as noted. The elements employed to accomplish these operations and functions within the metering apparatus 300 may be shared with other circuits, microcode, etc., that are employed to perform other functions and/or operations within the metering apparatus 300.

Figure 4:
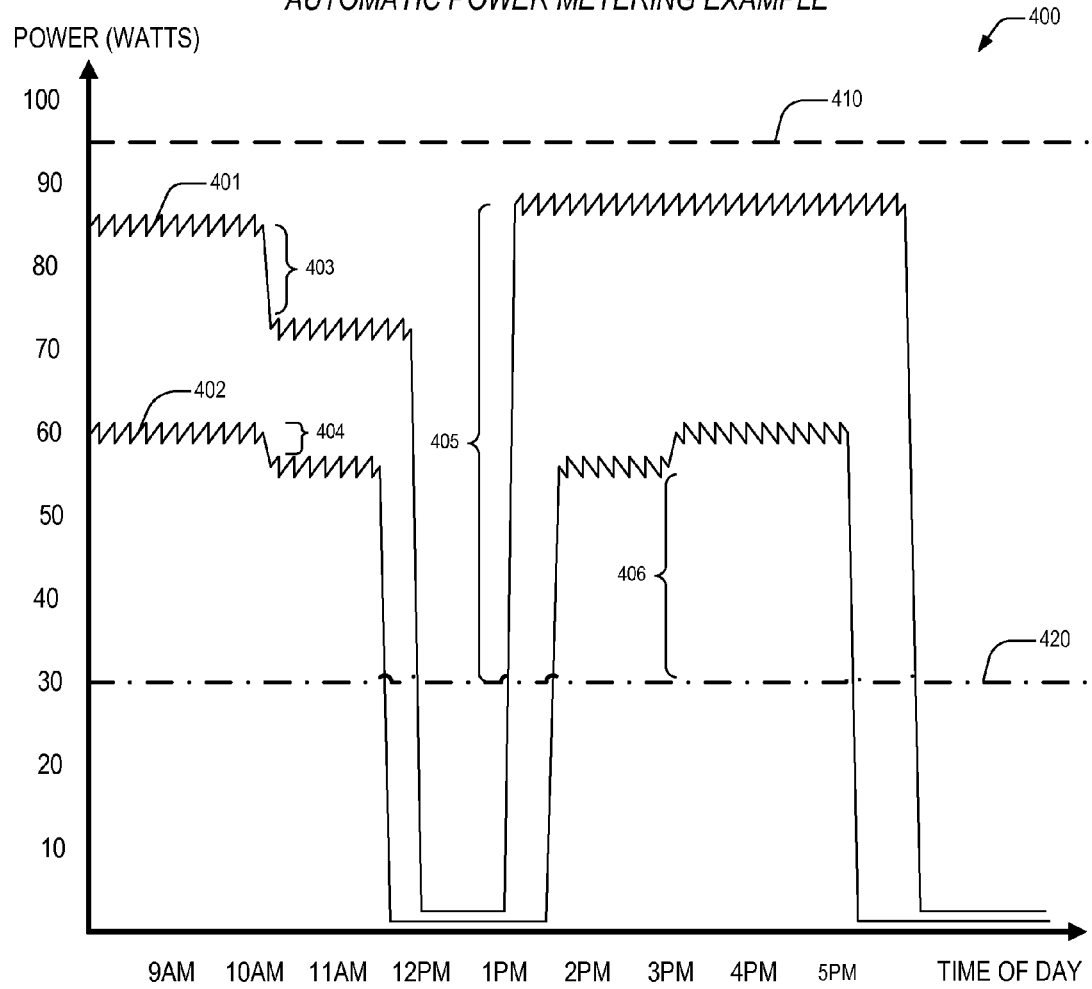
FIG. 4 is a timing diagram showing a power metering example according to the present invention.

Now turning to FIG. 4, a timing diagram 400 is presented showing a power metering example according to the present invention. Consider a lighting control system within a building that may control the function of two fluorescent 32 Watt 3-lamp ballasts. As one skilled in the art will appreciate, a lighting control system for a small building of, say, 30,000 square feet, may include more than 300 light fixtures, however, for clarity sake, only two fixtures are presented in order to teach advantageous aspects of a building outfitted with automatic power metering according to the present invention in all of its light fixtures.

Signal 401 represents the power consumed by a first fixture, and signal 402 represents the power consumed by a second fixture. It is assumed that both fixtures are controlled by the lighting control system, which consists of conventional daylight harvesters and occupancy sensors.

As is alluded to above, EMCs have not had a cost-effective method to measure and verify efficiency created by the installation of dynamic control systems for lighting, HVAC, and other loads in commercial buildings. Advantageously, by utilizing the low cost power metering technique according to the present invention, the efficiency created by a dynamic control system can be directly measured and communicated. Additionally, new valuable services such as enhanced demand response programs, peak demand management, time-of-use pricing management, and others are enabled or enhanced with according to the present invention. Furthermore, utilities may employ the present invention to measure the actual impact of an energy efficiency project in order to determine optimum incentives. Throughout the energy ecosystem, from power generation to consumption, from utility to EMC to building owner, the ability to cost effectively measure power at the device level according to the present invention provides the granular operational insights necessary to enhance existing practices, create new value-add services, and accelerate the proliferation of energy efficiency measures.

As the timing diagram 400 shows, sub-metering data is provided to a cloud-based aggregation node for, say, a typical 10-hour workday. A baseline composite limit 410, at 95 Watts, indicates a typical composite power consumption for each of the fixtures. A demand threshold limit 420, at 30 Watts, indicates a building owner's operational threshold for each fixture for a demand response event. That is, the demand threshold limit 420, is the limit below which the building owner deems the building non-operational. In the example shown, if power consumption were to drop below 30 Watts for each of the fixtures, it would be too dark to allow for safety, comfort, and/or productivity.

Even in the morning hours, it is seen that daylight harvesting is effective as the first fixture's power consumption is reduced to around 85 Watts and, since the second fixture is located in an area where higher daylight levels are obtainable, its power consumption can be reduced to approximately 60 Watts. Around 10 AM, external sunlight conditions provide for even further reductions in power consumption for both fixtures, and the power metering apparatus 300 provides the data that can be used to show fine grained daylight harvesting power reductions 403-404 for each of the fixtures.

Between 12 PM and 2 PM, occupancy sensors in the areas corresponding the first and second fixtures, respectively, provide indications that allow the lighting control system to reduce power to the fixtures even more.

At approximately 2 PM power is restored to the fixtures at levels required to achieve desired lighting levels when augmented by surrounding light. The lighting control system continues to employ both daylight harvesting and occupancy sensors throughout the remainder of the day to provide a minimum amount of power to the fixtures while enabling comfort conditions for occupants.

As noted above, a lighting control system absent the power metering apparatus according to the present invention would provide the same level of control and efficiency that is depicted in the timing diagram 400. However, without the granular operational insights afforded by the power metering apparatus and depicted in the timing diagram 400, many ESCOs will remain reluctant to deploy, and utilities will remain reluctant to provide incentives for dynamic control systems for commercial buildings.

Furthermore, the present invention enables a user to gather data beyond that which is available via existing metering solutions including, but not limited to, true power dissipated by the load and power factor correction circuit efficiency.

Although the present invention and its objects, features, and advantages have been described in detail, other embodiments are encompassed by the invention as well. For example, although many of the examples herein have been presented with reference to lighting control systems and light fixtures, the automatic power metering techniques according to the present invention may be applied to aggregations of equipment utilizing switched mode power supplies, such as, but not limited to, a server farm, botnet, domain servers, chillers, air handling units, pumps, and fans.

In addition, the embodiments disclosed herein contemplate measurement of voltages as input voltage sense, input current sense, and output voltage sense nodes along with processing of the measured voltages to render metering metrics that include input power to a device, output power delivered to a load, ad power factor for the device. However, the present inventors note that such embodiments provide for a comprehensive sub-metering component that will enable one skilled in the art to practice the invention, but that subsets of the embodiments are also comprehended as well. For example, it may be desirable to couple the power metering apparatus to one or two of the sense nodes (e.g., input voltage sense only) and to process the measured data to yield one or more metering metrics for the device (e.g., input voltage for the device). Clearly, numerous other subset embodiments can be practiced according to the present invention.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims.

What is claimed is:

1. An apparatus for automatic power metering within a device, the apparatus comprising:
   a metering element, coupled to a power factor correction circuit at one or more nodes, wherein said power factor correction circuit is coupled to a load side of a rectification circuit for rectifying an alternating current power signal, said metering element configured to measure and process values on said one or more nodes to generate one or more metering metrics for the device, wherein said rectification circuit and said power factor correction circuit are disposed within the device; and
   communication elements, configured to receive said one or more metering metrics, and configured to transmit said one or more metering metrics over a communications channel.

2. The apparatus as recited in claim 1, wherein said one or more nodes comprise a current sense node, an output voltage sense node, and an input voltage sense node.

3. The apparatus as recited in claim 1, wherein said one or more metering metrics comprise input power consumed by the device, output power transferred to a load of the device, and power factor corresponding to the device.

4. The apparatus as recited in claim 1, wherein said power factor correction circuit is disposed on an integrated circuit and the apparatus is disposed on said integrated circuit.

5. The apparatus as recited in claim 1, wherein said communication elements comprise wired transceivers.

6. The apparatus as recited in claim 1, wherein said communication elements comprise wireless radios.

7. The apparatus as recited in claim 1, wherein the device comprises a fluorescent light fixture.

8. The apparatus as recited in claim 1, wherein the device comprises a light emitting diode fixture.

9. The apparatus as recited in claim 1, wherein the device comprises a power supply.

10. A sub-metering mechanism within a device, the sub-metering mechanism comprising:
    a power factor correction circuit, coupled to current sense, output voltage sense, and input voltage sense nodes within the device, and coupled to a load side of a rectification circuit for rectifying an alternating current power signal, configured to control a switching transistor to shunt input current in parallel with a load to align first phase of said input current with second phase of an input voltage, wherein said rectification circuit and said power factor correction circuit are disposed within the device;
    a metering element, coupled to one or more of said nodes, configured to measure and process values on said nodes to generate one or more metering metrics for the device, said one or more metering metrics comprising input power consumed by the device, output power transferred to said load, and power factor corresponding to the device; and
    communication elements, configured to receive said one or more metering metrics, and configured to transmit said one or more metering metrics over a communications channel.

11. The sub-metering mechanism as recited in claim 10, wherein wherein said power factor correction circuit is disposed on an integrated circuit and the apparatus is disposed on said integrated circuit.

12. The sub-metering mechanism as recited in claim 10, wherein said communication elements comprise wired transceivers.

13. The sub-metering mechanism as recited in claim 10, wherein said communication elements comprise wireless radios.

14. The sub-metering mechanism as recited in claim 10, wherein the device comprises a fluorescent light fixture.

15. The sub-metering mechanism as recited in claim 10, wherein the device comprises a light emitting diode fixture.

16. The sub-metering mechanism as recited in claim 10, wherein the device comprises a power supply.

17. A method for automatically metering power within a device, the method comprising:

coupling a metering element to a power factor correction circuit at one or more nodes within the device, wherein the power factor correction circuit is coupled to a load side of a rectification circuit for rectifying an alternating current power signal, wherein the one or more nodes comprise a current sense node, and wherein the output voltage sense node, and an input voltage sense node, and wherein the power factor correction circuit and the rectification circuit are disposed within the device;

measuring and processing values on the nodes to generate one or more metering metrics for the device, wherein the one or more metering metrics comprise input power consumed by the device, output power transferred to a load of the device, and power factor corresponding to the device; and via communication elements, transmitting the one or more metering metrics over a communications channel.

18. The method as recited in claim 17, wherein wherein the power factor correction circuit is disposed on an integrated circuit and the apparatus is disposed of the integrated circuit.

19. The method as recited in claim 17, wherein the communication elements comprise wired transceivers.

20. The method as recited in claim 17, wherein said communication elements comprise wireless radios.

21. The method as recited in claim 17, wherein the device comprises a fluorescent light fixture.

22. The method as recited in claim 17, wherein the device comprises a light emitting diode fixture.

23. The method as recited in claim 17, wherein the device comprises a power supply.

* * * * *